United States Patent [19]

Weldman et al.

[11] Patent Number: 5,216,246

[45] Date of Patent: Jun. 1, 1993

[54] OPTICAL SAFETY SHUTOFF FOR MACHINE COVER

[75] Inventors: William T. Weldman, Rochester; Khalid M. Rabb, Webster; Michael L. Shaffer, Walworth; Karl M. Kau, Rochester; Frederick N. Rath, Honeoye Falls, all of N.Y.

[73] Assignee: Xerox Corporation, Stamford, Conn.

[21] Appl. No.: 829,835

[22] Filed: Feb. 3, 1992

[51] Int. Cl.$^5$ ............................................. G01D 5/34
[52] U.S. Cl. .................................. 250/229; 250/221
[58] Field of Search .................. 250/229, 221, 222.1, 250/561, 237 R; 340/555, 556, 557, 600; 341/31; 200/61.62, 61.7; 361/173, 174

[56] References Cited

U.S. PATENT DOCUMENTS

| | | | |
|---|---|---|---|
| H43 | 12/1984 | Michaels | 355/75 |
| 4,315,147 | 2/1982 | Harmer | 250/229 |
| 4,520,262 | 5/1985 | Denton | 250/221 |
| 4,692,612 | 9/1987 | Havel | 250/229 |
| 4,831,253 | 5/1989 | Omura et al. | 250/229 |
| 4,987,300 | 1/1991 | Robertson | 250/229 |

Primary Examiner—David C. Nelms
Assistant Examiner—K. Shami
Attorney, Agent, or Firm—Ronald F. Chapuran

[57] ABSTRACT

An interlock system for a machine cover including an optical sensor providing a cover open signal, a housing secured to the cover and defining a hollow cavity communicating with the optical path with the cover closed, a reflector fixed to one end of the cavity to reflect light to the sensor with the cover closed, a wall forming part of the housing and disposed in an interference relationship with the optical path for blocking light with the cover open, the length of the optical path with the cover open being less than the length of the optical path with the cover closed, and circuitry to trigger the optical sensor to provide light pulses at a predetermined frequency.

8 Claims, 3 Drawing Sheets

5,216,246

OPTICAL SAFETY SHUTOFF FOR MACHINE COVER

BACKGROUND OF THE INVENTION

The invention relates to an interlock system and more particularly, to an interlock system using a cheater proof optical sensor.

Various techniques have been used to minimize operator exposure to safety hazards such as moving parts, electrical charge or chemicals during machine operation. In this regard the use of safety interlock switches to inhibit machine operation with covers or doors open with the related exposure to safety hazards is well known in the prior art. For example, in current use are plunger type switches in which an electrical contact is changed by the movement of the plunger in response to the movement of the door or cover. See also the magnetic type switch units such as disclosed in U.S. Statutory Invention Registration H43 published Apr. 1, 1986.

A difficulty with the prior art devices is the relative ease in which interlock switches can be cheated or rigged in order to inhibit the appropriate signal from being conveyed when a door or cover is opened. For example, in a plunger type switch, a foreign object can be inserted between contacts to simulate that a cover is closed, when, in fact, the cover is open.

It is an object of the present invention, therefore, to provide a new and improved interlock switch that is not easily cheatable yet can be easily integrated into an existing system. Another object of the present invention is to provide an optical interlock switch that is dependent upon the length of an optical path and periodic pulsing of an LED for accurate operation. Still another object of the present invention is to provide an interlock switch that is physically secured and located in the machine to prevent tampering and to inhibit false signals. Further advantages of the present invention will become apparent as the following description proceeds and the features characterizing the invention will be pointed out with particularity in the claims annexed to and forming a part of this specification.

SUMMARY OF THE INVENTION

Briefly, the present invention is an interlock system for a machine cover including an optical sensor, a housing secured to the cover and defining a hollow cavity communicating with the optical path with the cover closed, a reflector fixed to one end of the cavity to reflect light to the sensor, a wall forming part of the housing and disposed in an interference relationship with the optical path and blocking light with the cover open, the length of the optical path with the cover open being less than the length of the optical path with the cover closed, and circuitry to trigger the optical sensor to provide light pulses at a predetermined frequency.

DESCRIPTION OF THE DRAWINGS

For a better understanding of the present invention, reference may be had to the accompanying drawings wherein the same reference numerals have been applied to like parts and wherein.

DETAILED DESCRIPTION OF THE INVENTION

Figure 1:
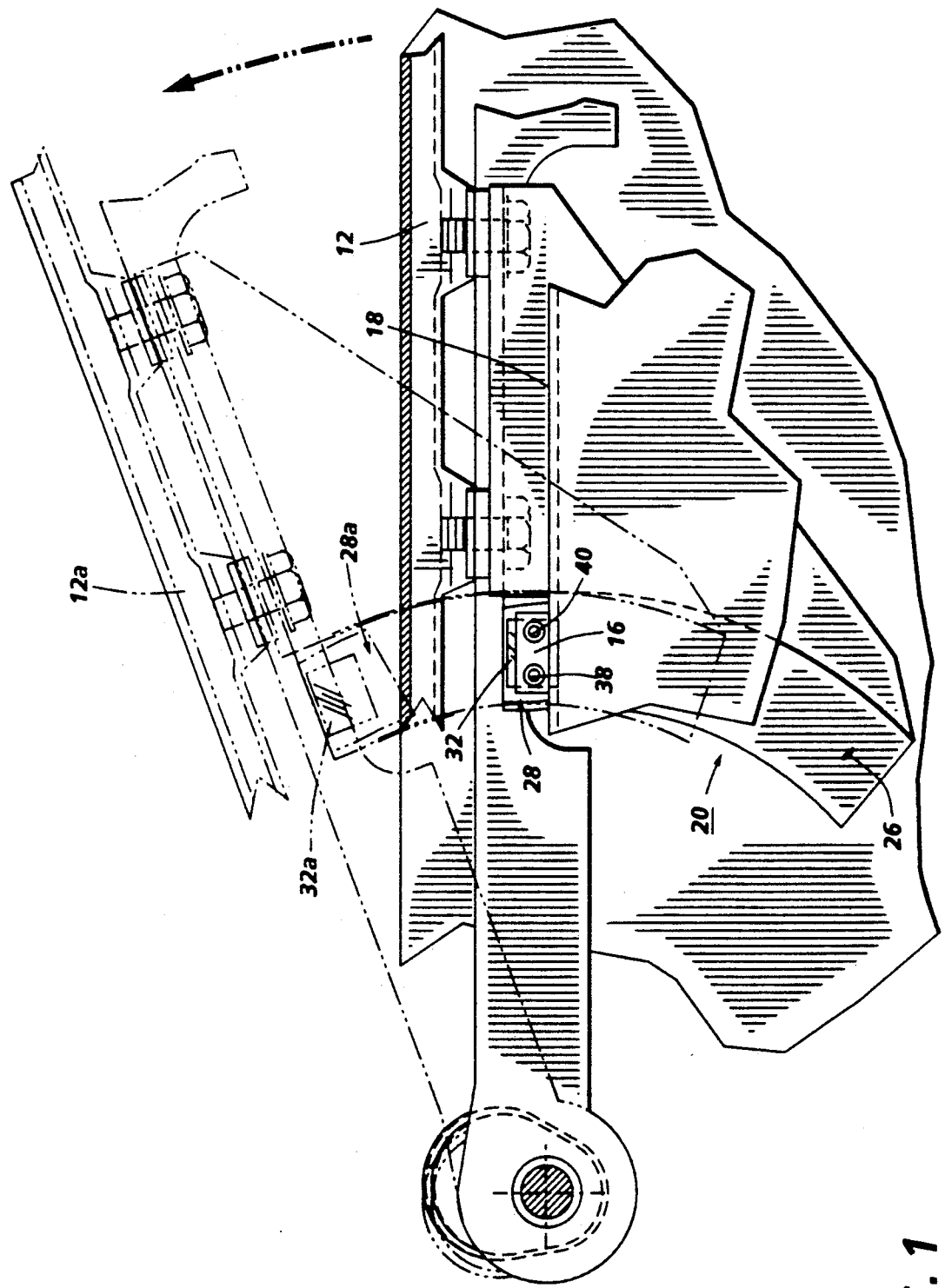
FIG. 1 is an elevational view of an interlock system in open and closed position in accordance with the present invention.
Figure 2:
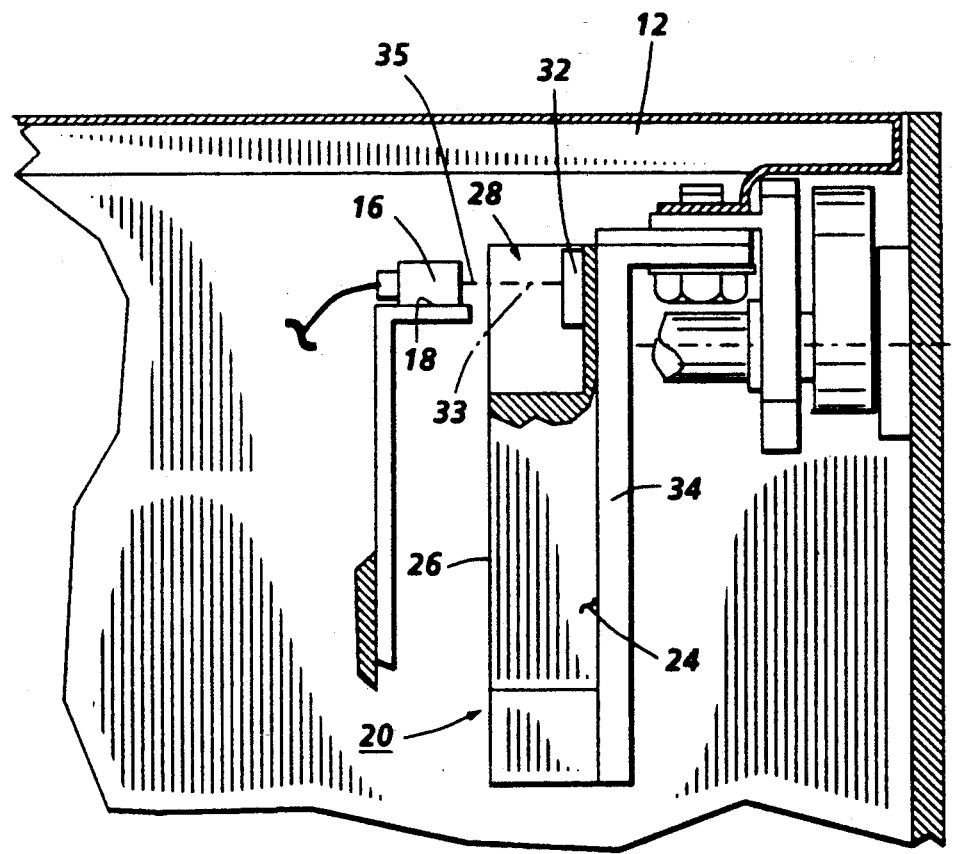
FIG. 2 is a side view of the system of FIG. 1 in closed position.

With reference to FIGS. 1 and 2 there is generally shown a portion of a machine frame at 10 including a pivotable lid or cover generally shown at 12, the cove 12 is adapted for opening and closing as assisted by suitable counter balanced springs generally shown at 14 with related hardware.

In most interlock systems, a given state of a sensing device corresponds to a given state of the system. For example, a closed cover actuates a switch which creates a low state signal for the control system. When the cover is open, the switch de-actuates and creates a high state signal for the control system. In this traditional system, one state of the system (cover open or cover closed) corresponds to a single state form a suitable sensing device. Unfortunately, machine operators have discovered in the use of traditional prior art interlock systems that unplugging a device creates the one state and shorting the correct wires of the device (i.e. signal to ground) creates the other state. Trial and error eventually yields the state that satisfies the control systems requirements and the interlock can be bypassed.

In accordance with the present invention, to overcome this problem an optical sensor 16 is mounted to the top 18 of the machine frame and an actuator 20, preferably plastic, is rigidly secured to the movable cover 12 of the machine. The cover is also shown in phantom, 12A in the open position in FIG. 1. The actuator is generally solid defined by walls 24 and 26, but generally providing a hollow cavity 28, beginning at an opening at one end of wall 26. At the other end of the hollowed cavity 28 is a reflector surface 32 fixed to the actuator 20. In operation, with the cover 12 closed, the cavity 28 and reflecting surface 32 are aligned with the sensor 16. Light from the optical sensor 16, preferably from an LED 38, is projected down the cavity 28 reflected from the reflecting surface 32 back to photo detector 40 of the sensor 16 generally illustrated by light beam 33. This provides a suitable signal to the system control of the closed state of the cover 12. When the cover 12 is open, the wall 26 of the actuator 20 obstructs the sensor 16, preventing the light from the LED to project down cavity 28 to be reflected back to the sensor 16. In this open state, there is provided a very distinct transition state or signal from the sensor 16 to the control.

As is apparent from the relationship of the actuator 20 to the sensor 16, with the cover in the open position, there is little tolerance or gap 35 between the sensor 16 and the wall 26. In addition, the actuator 20 is rigidly fixed to the cover, in particular to plate 34. This further inhibits an operator from illegitimately tampering with the sensor operation. Another means to minimize tampering with the sensor 16 and the open and closed cover relationships is to more precisely electronically control the transition states to satisfy the open and close cover positions, as shown in FIG. 2.

Figure 3:
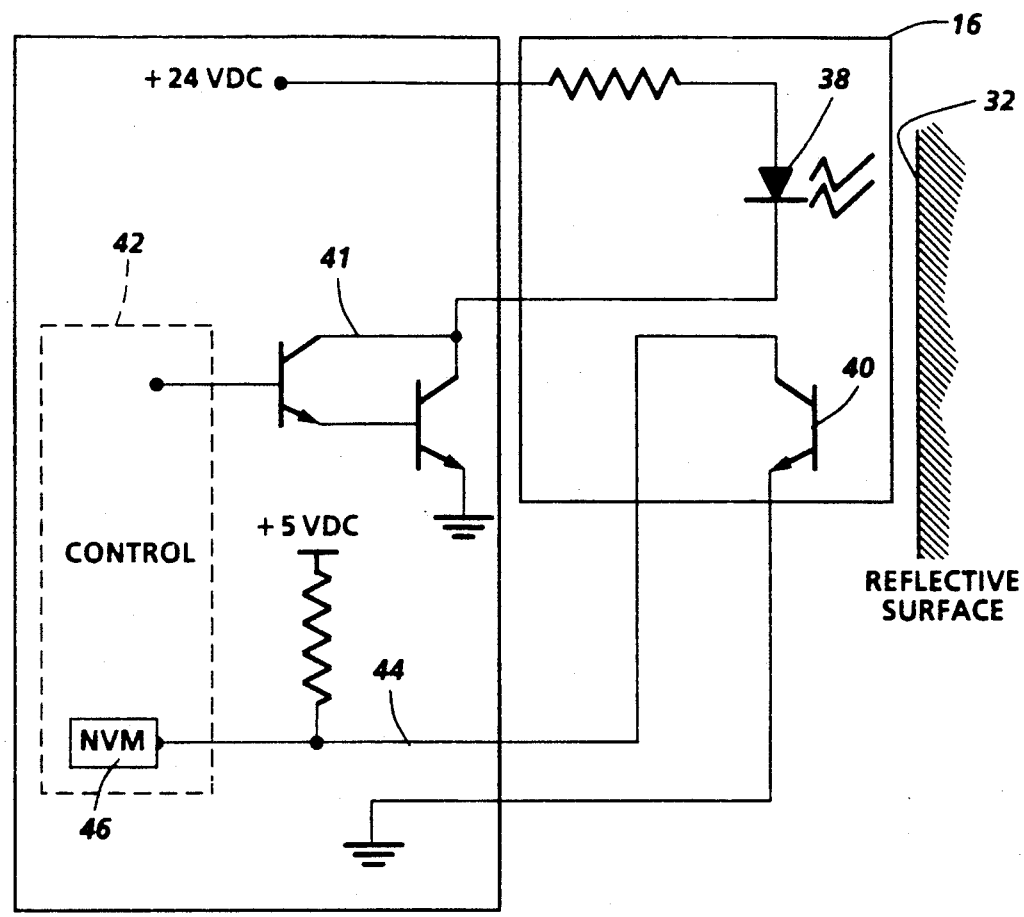
FIG. 3 is a circuit diagram for pulsing the LED of the interlock sensor in accordance with the present invention.

With reference to FIG. 3, in accordance with the present invention, a plus 24 volt switching power device is used to drive LED 38 of sensor 16 through suitable logic 46 connected to the control generally shown at 42. With the machine cover 12 closed, the reflective surface 30 is in the optical path in alignment with sensor 16. At this point, control 42 pulses LED 38 on and off which in turn pulses the detector 40 portion of sensor 16 on and off. As illustrated the detector 40 is interconnected to the control via line 44 to convey the detector 40 responses to the control 42.

Figure 4:
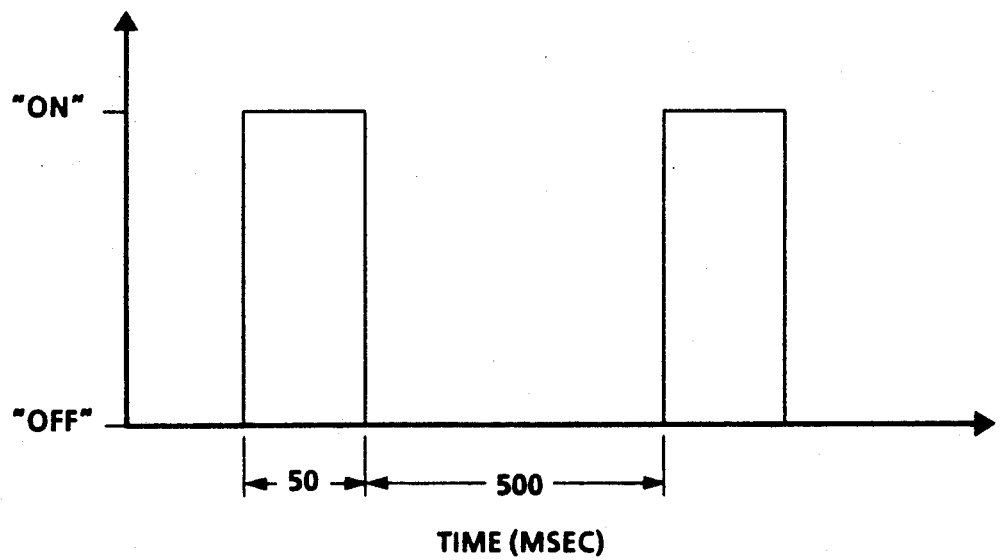
FIG. 4 illustrates the timing diagram for pulsing the LED in accordance with the present invention.

In accordance with the present invention, with reference to FIG. 4, the LED 38 is intermittently pulsed to obviate any noise or system tampering that invalidates true sensor responses and true cover open or cover closed conditions. In a preferred embodiment, a pulse of 50 milli seconds is provided at intervals of 500 milli seconds.

It should be noted that it is well within the scope of the present invention to provide pulse widths or frequency of pulses of varying time lengths. The essence is that the control 42 recognizes the time of expected true response form the detector 40 in order to evidence the correct cover position. It should also be noted that for a service representative to be able to raise the cover and yet still be able to operate the machine and perform diagnostics, the interlock switch can be electronically bypassed. By suitable activation of a switch or a setting of a flag in nonvolatile memory 46 of control 42 as illustrated in FIG. 3, it is possible for a service representative to deactivate the normal sensory responses in order to be able to diagnose and service the machine.

In accordance with another aspect of the present invention, it should be noted that the sensor 16 is positioned with a focal distance far enough from the reflective surface 32 to prevent tampering with the sensor characteristics. For example, if a highly reflective thin surface such as an aluminum foil was place in the small gap 35 between the actuator wall 26 and the sensor with the cover open, the sensor would not operate. That is, the sensor only operates if the reflective surface 32 is several millimeters distance, and this distance can not be fabricated with the cover open since the wall 26 of the actuator 20 eliminates or at least significantly reduces the length of the optical path from the LED 38 to the reflector 32 and back to the detector 40. With the cover closed, the light reflected from the reflective surface 32 contains sufficient energy to activate the photo detector 40. With the cover closed, even though the optical path is shorter, the light reflected from the non-reflective housing wall does not contain enough energy to activate the photo detector.

While there has been illustrated and described what is at present considered to be a preferred embodiment of the present invention, it will be appreciated that numerous changes and modifications are likely to occur to those skilled in the art, and it is intended in the appended claims to cover al those changes and modifications which fall within the true spirit and scope of the present invention.

We claim:

1. An interlock system for a machine cover having open and closed position comprising:
    an optical sensor having an optical path in relationship with the cover, the optical sensor providing a cover open signal and a cover closed signal,
    a housing secured to the cover and defining a hollow cavity communicating with the optical path with the cover closed,
    a reflector fixed to one end of the cavity to reflect light to the sensor with the cover closed,
    a wall forming part of the housing and disposed in an interference relationship with the optical path with the cover open, the wall blocking light with the cover open, the length of the optical path with the cover open being less than the length of the optical path with the cover closed, and
    a control electrically connected to the optical sensor and responsive to the signals form the optical sensor to inhibit operation of the machine when the cover is open, the control including circuitry to trigger the optical sensor to provide light pulses at a predetermined frequency.

2. The interlock system of claim 1 wherein the optical sensor includes an LED and photodetector and the LED provides 50 millisecond light pulses at 500 millisecond intervals.

3. The interlock system of claim 1 wherein the wall forming part of the housing and disposed in an interference relationship with the optical path with the cover open inhibits the projection of light to the reflector.

4. A machine interlock system for a movable element of the machine comprising:
    an optical sensor having an optical path in an interference relationship with the movable element, the optical sensor providing a first signal with the movable element in a first position and a second signal with the movable element in a second position,
    a control responsive to the first and second signals from the optical sensor, the control including a non-volatile memory,
    means to vary the optical path, the means to vary the optical path including a first surface in an interference relationship with the movable element in the first position and a second surface in an interference relationship with the movable element in the second position, the control responsive to the second signal to inhibit operation of the machine, and means to electronically bypass the sensor by setting an indicator in the nonvolatile memory.

5. The interlock system of claim 4 wherein the optical sensor provides light pulses at a predetermined interval.

6. An interlock system for a machine cover having open and closed positions comprising:
    an optical sensor having an optical path in relationship with the cover, the optical sensor providing a cover open signal and a cover closed signal, the optical sensor including an LED and optical detector,
    a housing secured to the cover and defining a hollow cavity communicating with the optical path with the cover closed,
    a reflector fixed to one end of the cavity to reflect light to the optical sensor with the cover closed, and
    a wall forming part of the housing and disposed in an interference relationship with the optical path with the cover open, the wall blocking light with the cover open, the length of the optical path with the cover open being less than the length of the optical path with the cover closed, and
    a control electrically connected to the optical sensor and responsive to the signals from the optical sensor to inhibit operation of the machine when the cover is open, the control including means to electrically bypass the sensor.

7. The interlock system of claim 6 wherein the LED provides light pulses at a predetermined interval.

8. The interlock system of claim 6 wherein the wall inhibits altering the optical path of the sensor.

* * * * *

UNITED STATES PATENT AND TRADEMARK OFFICE
CERTIFICATE OF CORRECTION

PATENT NO. : 5,216,246

DATED : June 1, 1993

INVENTOR(S) : Weidman et al

It is certified that error appears in the above-indentified patent and that said Letters Patent is hereby corrected as shown below:

On the title page, items 19 and 75, "Weldman" should read --Weidman--.

Signed and Sealed this

Fifteenth Day of March, 1994

Attest:

BRUCE LEHMAN

*Attesting Officer*    *Commissioner of Patents and Trademarks*